(12) United States Patent
Ausserlechner

(10) Patent No.: US 9,395,423 B2
(45) Date of Patent: *Jul. 19, 2016

(54) CURRENT SENSORS, SYSTEMS AND METHODS FOR SENSING CURRENT IN A CONDUCTOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/618,139

(22) Filed: Feb. 10, 2015

(65) Prior Publication Data

US 2015/0198679 A1    Jul. 16, 2015

Related U.S. Application Data

(63) Continuation of application No. 13/086,566, filed on Apr. 14, 2011, now Pat. No. 8,963,536.

(51) Int. Cl.
*G01R 33/07* (2006.01)
*G01R 33/09* (2006.01)
*G01R 15/20* (2006.01)

(52) U.S. Cl.
CPC ............ *G01R 33/091* (2013.01); *G01R 15/205* (2013.01); *G01R 33/072* (2013.01); *G01R 33/093* (2013.01); *G01R 33/096* (2013.01); *G01R 33/098* (2013.01)

(58) Field of Classification Search
CPC .............. G01R 15/205; G01R 15/202; G01R 19/0092; G01R 33/09; G01R 15/183; G01R 33/07; G01R 15/18; G01R 19/00; G01R 19/25; G01R 22/00; G01R 31/024; G01R 31/041; G01R 31/2853; G01R 31/3606; G01R 33/072; G01R 33/098; G01R 33/093; G01R 33/096; G01R 33/091; G01R 33/12; G01R 33/381; G01R 33/092; G01D 3/0365; G01N 27/72; G01N 27/9033; G01C 17/38

See application file for complete search history.

(56) References Cited

U.S. PATENT DOCUMENTS 3,323,057 A    5/1967  Mary
4,021,729 A    5/1977  Hudson
(Continued)

FOREIGN PATENT DOCUMENTS

DE    19821492        11/1999
DE    10233129 A1     2/2003
(Continued)

OTHER PUBLICATIONS

Specification, Claims, Abstract, Drawings and Filling Receipt for U.S. Appl. No. 14/281,228, filed May 19, 2014, Inventors: Ausserlechner, et al.

(Continued)

*Primary Examiner* — Vinh Nguyen
(74) *Attorney, Agent, or Firm* — Schiff Hardin LLP

(57) ABSTRACT

Embodiments relate to magnetic current sensors. In various embodiments, a current sensor can include a simple conductor having a constant cross-sectional profile, such as round, square or rectangular, and being generally free of any notches or slots to divert current and thereby having a simpler manufacturing process, lower resistance and improved mechanical robustness. In embodiments, the conductor can be formed of a non-magnetic conductive material, such as aluminum or copper.

25 Claims, 5 Drawing Sheets

(56) References Cited

U.S. PATENT DOCUMENTS

| | | | |
|---|---|---|---|
| 4,559,495 A | 12/1985 | Lienhard | |
| 4,894,610 A | 1/1990 | Friedl | |
| 5,017,804 A | 5/1991 | Harnden | |
| 5,041,780 A | 8/1991 | Rippel | |
| 5,173,758 A | 12/1992 | Heremans | |
| 5,642,041 A | 6/1997 | Berkcan | |
| 5,786,976 A | 7/1998 | Field | |
| 5,963,028 A | 10/1999 | Engel | |
| 6,310,470 B1 | 10/2001 | Hebing | |
| 6,341,416 B1 | 1/2002 | Biskeborn | |
| 6,356,068 B1 | 3/2002 | Steiner | |
| 6,424,018 B1 | 7/2002 | Ohtsuka | |
| 6,452,413 B1 | 9/2002 | Burghartz | |
| 6,462,531 B1 | 10/2002 | Ohtsuka | |
| 6,512,359 B1 | 1/2003 | Tamai | |
| 6,636,029 B1 | 10/2003 | Kunze | |
| 6,683,448 B1 | 1/2004 | Ohtsuka | |
| 6,727,683 B2 | 4/2004 | Goto | |
| 6,781,313 B2 | 8/2004 | Aiken | |
| 6,841,989 B2 | 1/2005 | Goto | |
| 6,940,265 B2 | 9/2005 | Hauenstein et al. | |
| 6,949,927 B2 | 9/2005 | Goetz | |
| 6,995,315 B2 | 2/2006 | Sharma | |
| 7,073,287 B2 | 7/2006 | Lau | |
| 7,075,287 B1 | 7/2006 | Mangtani | |
| 7,106,233 B2 | 9/2006 | Schroeder | |
| 7,129,691 B2 | 10/2006 | Shibahara | |
| 7,166,807 B2 | 1/2007 | Gagnon | |
| 7,259,545 B2 | 8/2007 | Stauth et al. | |
| 7,358,724 B2 | 4/2008 | Taylor | |
| 7,375,507 B2 | 5/2008 | Racz | |
| 7,474,093 B2 | 1/2009 | Ausserlechner | |
| 7,476,816 B2 | 1/2009 | Doogue | |
| 7,476,953 B2 | 1/2009 | Taylor | |
| 7,492,178 B2 | 2/2009 | Bidenbach | |
| 7,525,300 B2 | 4/2009 | Watanabe | |
| 7,528,593 B2 | 5/2009 | Tanizawa | |
| 7,545,136 B2 | 6/2009 | Racz | |
| 7,564,239 B2 | 7/2009 | Mapps | |
| 7,605,580 B2 | 10/2009 | Strzalkowski | |
| 7,709,754 B2 | 5/2010 | Doogue | |
| 7,746,056 B2 | 6/2010 | Stauth | |
| 7,768,083 B2 | 8/2010 | Doogue | |
| 7,816,905 B2 | 10/2010 | Doogue | |
| 7,923,987 B2 | 4/2011 | Ausserlechner | |
| 8,159,254 B2 | 4/2012 | Kaltalioglu | |
| 8,217,643 B2 | 7/2012 | Kuroki | |
| 8,283,742 B2 | 10/2012 | Motz et al. | |
| 8,421,442 B2 | 4/2013 | Younsi | |
| 8,679,895 B2 | 3/2014 | Motz et al. | |
| 8,680,843 B2 | 3/2014 | Ausserlechner | |
| 8,717,016 B2 | 5/2014 | Ausserlechner et al. | |
| 8,760,149 B2 | 6/2014 | Ausserlechner | |
| 2001/0052780 A1 | 12/2001 | Hayat-Dawoodi | |
| 2003/0155905 A1 | 8/2003 | Hauenstein | |
| 2004/0155644 A1 | 8/2004 | Stauth | |
| 2005/0030004 A1 | 2/2005 | Takatsuka | |
| 2005/0270013 A1 | 12/2005 | Berkcan | |
| 2005/0270014 A1 | 12/2005 | Zribi | |
| 2006/0076947 A1 | 4/2006 | Berkcan | |
| 2006/0255797 A1 | 11/2006 | Taylor | |
| 2006/0284613 A1 | 12/2006 | Hastings | |
| 2007/0063690 A1 | 3/2007 | De Wilde et al. | |
| 2008/0035923 A1 | 2/2008 | Tschmelitsch | |
| 2008/0143329 A1 | 6/2008 | Ishihara | |
| 2008/0297138 A1 | 12/2008 | Taylor | |
| 2008/0312854 A1 | 12/2008 | Chemin | |
| 2009/0026560 A1 | 1/2009 | Wombacher | |
| 2009/0050990 A1 | 2/2009 | Aono | |
| 2009/0058412 A1 | 3/2009 | Taylor | |
| 2009/0128130 A1 | 5/2009 | Stauth | |
| 2009/0152595 A1 | 6/2009 | Kaga | |
| 2009/0184704 A1 | 7/2009 | Guo | |
| 2009/0294882 A1 | 12/2009 | Sterling | |
| 2009/0295368 A1 | 12/2009 | Doogue | |
| 2009/0322325 A1 | 12/2009 | Ausserlechner | |
| 2010/0045285 A1 | 2/2010 | Ohmori | |
| 2010/0045286 A1 | 2/2010 | Hotz | |
| 2010/0117638 A1 | 5/2010 | Yamashita | |
| 2010/0156394 A1 | 6/2010 | Ausserlechner | |
| 2010/0231198 A1 | 9/2010 | Bose | |
| 2010/0237853 A1 | 9/2010 | Bose | |
| 2010/0259250 A1* | 10/2010 | Kahlman | G01R 33/093 324/207.2 |
| 2010/0315095 A1 | 12/2010 | Younsi | |
| 2011/0133732 A1 | 6/2011 | Sauber | |
| 2011/0172938 A1 | 7/2011 | Gu | |
| 2011/0204887 A1 | 8/2011 | Ausserlechner | |
| 2011/0221429 A1 | 9/2011 | Tamura | |
| 2011/0227560 A1 | 9/2011 | Haratani | |
| 2011/0234215 A1 | 9/2011 | Ausserlechner | |
| 2011/0248711 A1 | 10/2011 | Ausserlechner | |
| 2011/0298454 A1 | 12/2011 | Ausserlechner | |
| 2011/0304327 A1 | 12/2011 | Ausserlechner | |
| 2012/0049884 A1 | 3/2012 | Kaltalioglu | |
| 2012/0086433 A1 | 4/2012 | Cheng | |
| 2012/0112365 A1 | 5/2012 | Ausserlechner | |
| 2012/0146164 A1 | 6/2012 | Ausserlechner | |
| 2012/0146165 A1 | 6/2012 | Ausserlechner | |
| 2012/0262152 A1 | 10/2012 | Ausserlechner | |
| 2013/0106412 A1 | 5/2013 | Nomura | |
| 2013/0113477 A1 | 5/2013 | Ausserlechner | |
| 2013/0265041 A1 | 10/2013 | Friedrich | |
| 2014/0183534 A1 | 7/2014 | Motz et al. | |

FOREIGN PATENT DOCUMENTS

| | | |
|---|---|---|
| DE | 10231194 | 2/2004 |
| DE | 19946935 | 2/2004 |
| DE | 10051160 B4 | 1/2007 |
| DE | 602005003777 T2 | 12/2008 |
| WO | 01/23899 A1 | 4/2001 |
| WO | 2005/033718 A1 | 4/2005 |
| WO | 2008/008140 | 1/2008 |
| WO | 2009/088767 | 9/2009 |

OTHER PUBLICATIONS

Specification, Claims, Abstract, Drawings and Filing Receipt for U.S. Appl. No. 14/261,939, filed Apr. 25, 2014, Inventors: Ausserlechner, et al.

Wang et al., "Investigation on the Signal Processing Algorithms Applied in the Multi-Sensor System Measuring Electric Current", Proceedings of the CSEE. vol. 25, No. 22 (2005).

Hopkins, Allegro MicroSystems, Inc., High-Performance Power ICs and Hall-Effect Sensors, "Hall Effect Technology for Server, Backplane and Power Supply Applications," IBM 1008 Power and Cooling Symposium, Sep. 30, 2008, 34 pages.

Application and File History for U.S. Appl. No. 13/626,456, filed Sep. 25, 2012, Inventors: Ausserlechner, et al.

Application and File history for U.S. Appl. No. 12/711,471, filed Feb. 24, 2010, Inventors: Ausserlechner, et al.

Application and File history for U.S. Appl. No. 12/756,652, filed Apr. 8, 2010, Inventors: Udo Ausserlechner.

Application and File history for U.S. Appl. No. 12/813,218, filed Jun. 10, 2010, Inventor: Udo Ausserlechner.

Application and File history for U.S. Appl. No. 12/872,665, filed Aug. 31, 2010, Inventors: Ausserlechner, et al.

Application and File history for U.S. Appl. No. 12/963,787, filed Dec. 9, 2010, Inventor: Udo Ausserlechner.

Application and File history for U.S. Appl. No. 12/963,817, filed Dec. 9, 2010, Inventors: Ausserlechner, et al.

Application and File history for U.S. Appl. No. 13/012,096, filed Jan. 24, 2011, Inventors: Ausserlechner, et al.

Steiner, et al., "Fully Packaged CMOS Current Monitor Using Lead-On-Chip Technology," Physical Electronics Laboratory, pp. 603-608, © 1998.

(56) References Cited

OTHER PUBLICATIONS

Lutz, et al., "Double-Sided Low-Temperature Joining Technique for Power Cycling Capability at High Temperature," EPE 2005—Dresden, ISBN: 90-75815-08-5.

Schwarzbauer, et al., "Novel Large Area Joining Technique for Improved Power Device Performance," IEEE Transactions on Industry Applications, vol. 27, No. 1, pp. 93-95, 1991.

Allego, Allego Hall Effect-Based Current Sensor ICs: Revolutionary, high accuracy, high bandwidth current sensing!, www.allegomicro.com/en/Products/Design/curren_sensors/index.asQ, 5 pages, © 2010.

Allego, Hall-Effect Sensor IC's: Current Sensor ICs, 1 page,© 2010.

Allego, High Bandwidth, Fast Fault Response Current Sensor IC in Thermally Enhanced Package, ACS709-DS, www.microallegro.com, 16 pages, © 2008-2009.

Allego, Fully Integrated, Hall Effect-Based Linear Current Sensor IC with 2.1 kVRMS Isolation and a Low-Resistance Current Conductor, ACS712-DS, Rev. 13, 14 pages,© 2006-2010.

Sandireddy, Sandhya, IEEEXplore, ©2005, Advanced Wafer Thinning Technologies to Enable Multichip Packages, pp. 24-27.

Application and File history for U.S. Appl. No. 12/630,596, filed Dec. 3, 2009. Inventors: Ausserlechner et al.

* cited by examiner

CURRENT SENSORS, SYSTEMS AND METHODS FOR SENSING CURRENT IN A CONDUCTOR

This application is a continuation of application Ser. No. 13/086,566, filed on Apr. 14, 2011, now U.S. Pat. No. 8,963,536.

TECHNICAL FIELD

The invention relates generally to current sensors and more particularly to magnetic current sensors suitable, for example, for high currents of up to about 500 Amps (A).

BACKGROUND

Conventional magnetic sensors for sensing current are known. Some current sensing systems utilize closed-loop principles, in which a magnetic sensor is used as a null detector, and the system generates a compensating field that cancels the magnetic field of the current to be measured. While accurate, such systems can suffer from a large power drain needed to generate the magnetic compensation field.

Other systems are open-loop, which are generally less accurate than the aforementioned closed-loop systems. Open-loop systems typically use linear magnetic field sensors, such as Hall plates, and need specially shaped conductors which can be difficult and expensive to manufacture.

These and other current sensors can also suffer from other drawbacks, including hysteresis effects, non-linearity, limited cover-current capabilities, and/or magnetic shielding, among others. Therefore, there is a need for improved current sensing systems and methods.

SUMMARY

Current sensors, systems and methods are disclosed. In an embodiment, a current sensing system comprises a conductor having a constant cross-section along a current path; a substrate coupled with respect to the conductor; and a plurality of sensor elements arranged on a surface of the substrate, a first of the plurality of sensor elements arranged at a midpoint of the conductor, a second of the plurality of sensor elements arranged on a first side of the first and spaced apart by a distance, and a third of the plurality of sensor elements arranged on a second side of the first and spaced apart by the distance, wherein an output of the sensing system is related to a signal from the first minus a signal from the second divided by two minus a signal from the third divided by two.

In an embodiment, a method comprises forming a current sensor comprising a conductor having a constant cross-section along a current path, a substrate coupled with respect to the conductor; and three sensor elements arranged equidistantly spaced apart on a surface of the substrate with a first of the three arranged at a center point of the conductor; causing a current to flow in the conductor, thereby inducing a magnetic field that can be sensed by the sensor elements; and receiving an output of the current sensor related to a signal from the first of the three sensor elements minus half of a signal from a second of the three minus half of a signal from the third of the three.

In an embodiment, a current sensing system comprises a conductor having a constant cross-section along a current path; a substrate coupled with respect to the conductor; and at least two sensor elements spaced apart from one another and arranged along an axis on a surface of the substrate, a first of the at least two sensor elements arranged at a first distance relative to a center line of the conductor and a second of the at least two sensor elements arranged at a second distance relative to the center line of the conductor, the first and second distances being unequal and the center line of the conductor being perpendicular to the axis, and the at least two sensor elements being sensitive to magnetic field components parallel to the surface and induced by current flow in the conductor.

BRIEF DESCRIPTION OF THE DRAWINGS

The invention may be more completely understood in consideration of the following detailed description of various embodiments of the invention in connection with the accompanying drawings, in which.

Figure 1:
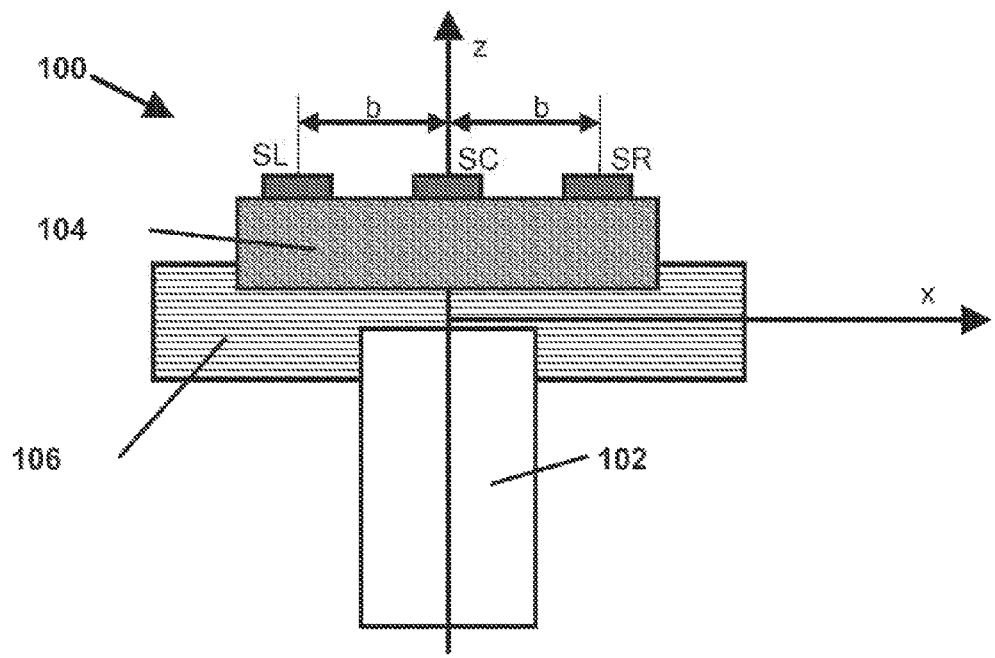
FIG. 1 depicts a current sensor system according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetic current sensors. In various embodiments, a current sensor can comprise a simple conductor having a constant cross-sectional profile, such as round, square or rectangular, and being generally free of any notches or slots to divert current and thereby having a simpler manufacturing process, lower resistance and improved mechanical robustness. In embodiments, the conductor can comprise a non-magnetic conductive material, such as aluminum or copper.

Referring to FIG. 1, an embodiment of a magnetic current sensor system 100 comprises a conductor 102. Conductor 102 has a simple, constant cross-sectional profile, such as round, square or rectangular, and can be symmetrical with respect to the z-axis (as depicted in FIG. 1) in embodiments. In embodiments, the orientation of conductor 102 with respect to substrate 104 can be rotated 90 degrees, such that a major surface of conductor 102 is parallel to a major surface of substrate 104. The particular orientation of conductor 102 can vary in embodiments, for example with respect to aspect ratio as discussed herein below.

Conductor 102 can be coupled to a substrate 104, which can comprise silicon, glass, ceramic or some other suitable material in embodiments. In an embodiment, a voltage isolation layer 106 is provided between conductor 102 and substrate 104. Substrate 104 comprises a magnetic field sensor element in embodiments. In one embodiment, substrate 104 comprises at least two magnetic field sensor elements. In the embodiment of FIG. 1, substrate 104 comprises three magnetic sensor elements, SL, SC and SR, which can provide improved suppression of background magnetic fields when compared with a two-element system. A triple Hall system is disclosed in co-pending U.S. application Ser. No. 12/630, 596, which is incorporated herein by reference in its entirety.

Sensor elements SL, SC and SR can be disposed on either the top or bottom surface of substrate 104 and are held in a fixed position relative to conductor 102 by substrate 104. Sensor elements SL, SC and SR can be disposed relative to conductor 102 in different ways in various embodiments. For example, FIG. 1 depicts the sensor elements arranged along an axis x, with SC at x=0, SL at x=−b and SR at x=+b. In other embodiments, the sensor elements can be arranged along a different axis or can be arranged essentially along an axis. For example, one or more the elements can be shifted slightly off the axis defined by the other sensor elements, such as by about 1 or 2 mm, though such an arrangement can degrade suppression of magnetic field gradients perpendicular to the axis. Other configurations are also possible.

Sensor elements SL, SC and SR are sensitive to a component, Bx, of a magnetic field that is parallel to the flat surface of substrate 104 on which sensor elements SL, SC and SR are mounted and perpendicular to a direction of current flow in conductor 102. Sensor elements SL, SC and SR are disposed asymmetrically such that each experiences a different magnetic field. For example, current flowing in conductor 102 can cause a Bx-component Bx1 on SL, Bx2 on SC and Bx3 on SR. In one embodiment comprising only two magnetic sensor elements SL and Sr, Bx1 is equal to −Bx3, but this can be difficult to achieve in practice. In embodiments, a more realistic result is Bx1>Bx3>0.

Sensor 100 determines a difference of the Bx components at the at least two magnetic field sensors:

Signal=(Signal of Sensor 1)−(Signal of Sensor 2)

where Signal of Sensor 1 is substantially proportional to Bx1 and Signal of Sensor 2 is substantially proportional to Bx3. Thus, sensor system 100 is a first-order gradiometer, which cancels homogeneous background magnetic fields, because if the magnetic disturbance is equal on each sensor element and both sensor elements respond equally to the disturbance, the disturbance cancels upon the subtraction.

Referring again to the embodiment of FIG. 1, three sensor elements SL, SC and SR provide even better suppression of background magnetic fields. Sensor elements SL, SC and SR are arranged equidistantly spaced apart on substrate 104 a single axis in an embodiment, referred to for convenience herein as the xi-axis with respect to the orientation of FIG. 1. In this embodiment, sensor system 100, now a second-order gradiometer, determines:

Signal=(Signal of *SC*)−(Signal of *SL*)/2−(Signal of *SR*)/2

Thus, this embodiment cancels not only homogeneous background magnetic fields but also fields with a spatial dependence that is a linear function of the coordinate xi. System 100 of FIG. 1, with SL, SC and SR, therefore provides better suppression of magnetic disturbances than the simple two-sensor element embodiment previously discussed.

Sensor elements SL, SC and SR need not be perfectly linear, though reasonable linearity is desired for small magnetic fields, as appreciated by those skilled in the art. Further, the magnetic sensitivity of sensor elements SL, SC and SR can depend on other components of the magnetic field (crosstalk of orthogonal magnetic field components). For example, external magnetic fields in directions other than Bx could alter the magnetic sensitivity of sensor elements SL, SC and SR. Sensor system 100, however, can provide a small magnetic auto-calibration field (refer, e.g., to FIG. 7) of known intensity which can be switched on and off periodically in a defined pattern in embodiments or stochastically in, for example, spread spectrum communications systems of other embodiments. Sensor system 100 can then extract this pattern, a so-called auto-calibration pattern, from other sensor signals by phase synchronous detection. By comparing the strength of the sensor response on the auto-calibration sequence with the signal related to the current in conductor 102, system 100 can infer the current even not knowing the sensitivity of the sensor element SL, SC and/or SR. The auto-calibration magnetic field does not need to compensate the entire field caused by the current to be measured in conductor 102 in embodiments; therefore, the power to generate the auto-calibration magnetic field is lower than in other closed-loop systems.

For example, in one embodiment a single, slightly nonlinear sensor element SC and auto-calibration are used. "Slightly nonlinear" means that the output signal is a non-linear function of the applied field:

$$\text{Sig} = K_0 + K_1 B_x + K_2 B_x^2$$

If K2=0, the sensor is linear. Thus, the nonlinearity is defined by the magnitude of K2: the larger |K2|, the more nonlinear the sensor. The signal should vanish for vanishing Bx-field, $K_0=0$, which means that the zero point error is negligible. The system still works, however, if all sensor elements have identical K0, or at least stable K0 with respect to operating conditions such as lifetime and temperature.

Suppose in one embodiment that the x-component of the total magnetic field applied to the sensor element SC is a superposition of a disturbance field $B_{xd}$, a field $C_x I$ of the primary current/(the current through the current rail to be measured), and a field $B_{x,acal} = C_{acal} I_{acal}$ of the autocal-current $I_{acal}$:

$$B_x = B_{xd} + C_x I + C_{acal} I_{acal}.$$

Further suppose that the y-component of the total magnetic field applied to the sensor element is $$B_y = B_{yd}$$

which is the y-component of a magnetic disturbance field acting on the sensor element SC. The functions $K_0, K_1, K_2$ can be arbitrary functions of the By-component, which means that the crosstalk between x- and y-components can be arbitrary. The functions $K_0, K_1, K_2$ can also be arbitrary functions of temperature, mechanical stress, and lifetime.

System 100 applies an auto-calibration field of a certain frequency $f_{acal}$ and extracts the $1^{st}$ and $2^{nd}$ harmonic of this frequency from the signal:

$$2^{nd} \text{ harmonic: } \text{Sig}_2 = K_2 (C_{acal} I_{acal})^2,$$

from which system 100 can compute $K_2 = (C_{acal} I_{acal})^2 / \text{Sig}_2$ because it knows $C_{acal}$ and $I_{acal}$.

$$1^{st} \text{ harmonic: } \text{Sig}_1 = K_1 C_{acal} I_{acal} + 2 K_2 C_{acal} I_{acal} (B_{xd} + C_x I)$$

If the auto-calibration magnetic field is switched off, the signal becomes $$\text{Sig}_0 = K_0 + K_1 (B_{xd} + C_x I) + K_2 (B_{xd} + C_x I)^2$$

If the auto-calibration field is not switched off, the time average over integer multiples of the period of the auto-calibration frequency becomes $$Sig_0' = K_0 + K_1(B_{xd} + C_x I) + K_2(B_{xd} + C_x I)^2 + K_2(C_{acal} I_{acal})^2/2 = Sig_0 + Sig_2/2$$

$Sig_0'$ contains the same information as $Sig_0$ so that one can choose to switch off or on the auto-calibration magnetic field during the integration time.

Thus, the system has 3 equations:

$$Sig_2 = K_2(C_{acal} I_{acal})^2/2 \quad \text{Equation 1}$$

$$Sig_1 = K_1 C_{acal} I_{acal} + 2K_2 C_{acal} I_{acal}(B_{xd} + C_x I) \quad \text{Equation 2}$$

$$Sig_0 = K_0 + K_1(B_{xd} + C_x I) + K_2(B_{xd} + C_x I)^2 \quad \text{Equation 3}$$

If K0, K1, K2 and (Bxd+Cx*I) are unknown, three equations are not enough to determine the four unknowns. If K0 is negligible, the system can solve for the three unknowns.

Extending the theory to a first-order gradiometer, the system comprises two sensor elements, SL and SR, which are subtracted:

$$Sig = Sig^{(L)} - Sig^{(R)}$$

Then the $0^{th}$, $1^{st}$, and $2^{nd}$ harmonics of the signal become $$Sig_2 = K_2^{(L)}(C_{acal}^{(L)} I_{acal})^2/2 - K_2^{(R)}(C_{acal}^{(R)} I_{acal})^2/2 \quad \text{Equation 1}$$

$$Sig_1 = K_1^{(L)} C_{acal}^{(L)} I_{acal} + 2K_2^{(L)} C_{acal}^{(L)} I_{acal}(B_{xd}^{(L)} + C_x^{(L)} I) - K_1^{(R)} C_{acal}^{(R)} I_{acal} - 2K_2^{(R)} C_{acal}^{(R)} I_{acal}(B_{xd}^{(R)} + C_x^{(R)} I) \quad \text{Equation 2}$$

$$Sig_0 = K_0^{(L)} + K_1^{(L)}(B_{xd}^{(L)} + C_x^{(L)} I) + K_2^{(L)}(B_{xd}^{(L)} + C_x^{(L)} I)^2 - K_0^{(R)} - K_1^{(R)}(B_{xd}^{(R)} + C_x^{(R)} I) - K_2^{(R)}(B_{xd}^{(R)} + C_x^{(R)} I)^2 \quad \text{Equation 3}$$

Here we assume that all parameters K0, K1, K2 of sensor elements SL and SR are different and also that the disturbance field and the field from the primary current are different on both sensor elements SL and SR.

To a high degree we can assume that the two sensor elements SL and SR match well. This provides $$K_0^{(L)} = K_0^{(R)}, K_1^{(L)} = K_1^{(R)}, K_2^{(L)} = K_2^{(R)}.$$

Moreover we can assume that the disturbance magnetic field is relatively homogeneous, such that $B_{xd}^{(L)} = B_{xd}^{(R)}$. Also, the auto-calibration field has an equal magnitude but opposite sign on both sensor elements $C_{acal}^{(L)} = -C_{acal}^{(R)}$, yet not necessarily the field of the primary current. Then:

$$Sig_2 = 0 \quad \text{Equation 1}$$

$$Sig_1 = -2C_{acal} I_{acal}\{K_1 + 2K_2 B_{xd} + K_2 I(C_x^{(L)} + C_x^{(R)})\} \quad \text{Equation 2}$$

$$Sig_0 = \{K_1 + 2K_2 B_{xd} + K_2 I(C_x^{(L)} + C_x^{(R)})\}(C_x^{(L)} - C_x^{(R)})I \quad \text{Equation 3}$$

which provides:

$$Sig_0 = \frac{Sig_1}{-2C_{acal} I_{acal}}(C_x^{(L)} - C_x^{(R)})I$$

and finally:

$$I = -2\frac{C_{acal} I_{acal}}{C_x^{(L)} - C_x^{(R)}} \frac{Sig_0}{Sig_1}$$

In this last equation, note that there is no parameter of the sensor elements SL, SR involved (no K0, K1, K2). There are only the constants Cacal, CxL, CxR which are determined by pure geometrical relationship between the primary current and the sensor elements SL, SR and between the auto-calibration current and the sensor elements SL, SR. The ratio of mean and $1^{st}$ harmonic of the sensor signals is independent of gain errors of the circuit and therefore generally very accurate. Note the requirement in embodiments, however, that the auto-calibration current generates fields in opposite directions on both sensor elements SL and SR:

$$I_{acal} C_{acal}^{(L)} = -I_{acal} C_{acal}^{(R)}.$$

This perfect symmetry can be achieved, for example, if the auto-calibration coils or wire traces are manufactured with the same technology as the sensor elements, e.g. as part of the semiconductor manufacturing flow, in embodiments.

Now we extend the theory to a $2^{nd}$ order gradiometer, such as is depicted in FIG. 1 with three sensor elements: a left SL, a right SR and a center SC, which are combined by:

$$Sig = 2Sig^{(C)} - (Sig^{(L)} + Sig^{(R)})$$

Then the $0^{th}$, $1^{st}$ and $2^{nd}$ harmonics of the signal become $$Sig_2 = K_2^{(C)}(C_{acal}^{(C)} I_{acal})^2 - K_2^{(L)}(C_{acal}^{(L)} I_{acal})^2/2 - K_2^{(R)}(C_{acal}^{(R)} I_{acal})^2/2 \quad \text{Equation 1}$$

$$Sig_1 = 2K_1^{(C)} C_{acal}^{(C)} I_{acal} + 4K_2^{(C)} C_{acal}^{(C)} I_{acal}(B_{xd}^{(C)} + C_x^{(C)} I) - K_1^{(L)} C_{acal}^{(L)} I_{acal} - 2K_2^{(L)} C_{acal}^{(L)} I_{acal}(B_{xd}^{(L)} + C_x^{(L)} I) - K_1^{(R)} C_{acal}^{(R)} I_{acal} - 2K_2^{(R)} C_{acal}^{(R)} I_{acal}(B_{xd}^{(R)} + C_x^{(R)} I) \quad \text{Equation 2}$$

$$Sig_0 = 2K_0^{(C)} + 2K_1^{(C)}(B_{xd}^{(C)} + C_x^{(C)} I) + 2K_2^{(C)}(B_{xd}^{(C)} + C_x^{(C)} I)^2 - K_0^{(L)} - K_1^{(L)}(B_{xd}^{(L)} + C_x^{(L)} I) - K_2^{(L)}(B_{xd}^{(L)} + C_x^{(L)} I)^2 - K_0^{(R)} - K_1^{(R)}(B_{xd}^{(R)} + C_x^{(R)} I) - K_2^{(R)}(B_{xd}^{(R)} + C_x^{(R)} I)^2 \quad \text{Equation 3}$$

For good matching of the three sensor elements SL, SC and SR we get:

$$K_0^{(L)} = K_0^{(C)} = K_0^{(R)}, K_1^{(L)} = K_1^{(C)} = K_1^{(R)}, K_2^{(L)} = K_2^{(C)} = K_2^{(R)}$$

For homogeneous magnetic disturbance fields or fields with linear gradients only we get:

$$2B_{xd}^{(C)} - B_{xd}^{(L)} - B_{xd}^{(R)} = 0.$$

For a solution we choose $C_{acal}^{(C)}$, $C_{acal}^{(L)}$, $C_{acal}^{(R)}$ so that $Sig_2 \neq 0$. One possible solution is $C_{acal}^{(C)} \neq 0$, $C_{acal}^{(L)} = C_{acal}^{(R)} = 0$. Then from $Sig_2$ follows $K_2$. Equations 2 and 3 have two unknowns, the current I and $K_1$. It is therefore possible to solve this system of equations.

Unfortunately, it is generally not possible to eliminate all terms of the disturbance field. Thus, the system is affected by background magnetic field but only to a moderate degree.

This principle can also be used for sensors with third-order nonlinearities. In such embodiments, one can also sample the third harmonic of the auto-calibration frequency to obtain an additional equation with which the system can determine K3.

Due to symmetry in some sensor configurations, even-order coefficients like K2 can vanish. In these embodiments, the second harmonic can also vanish, and the number of equations as well as the number of unknown coefficients is reduced by one.

Figure 7:
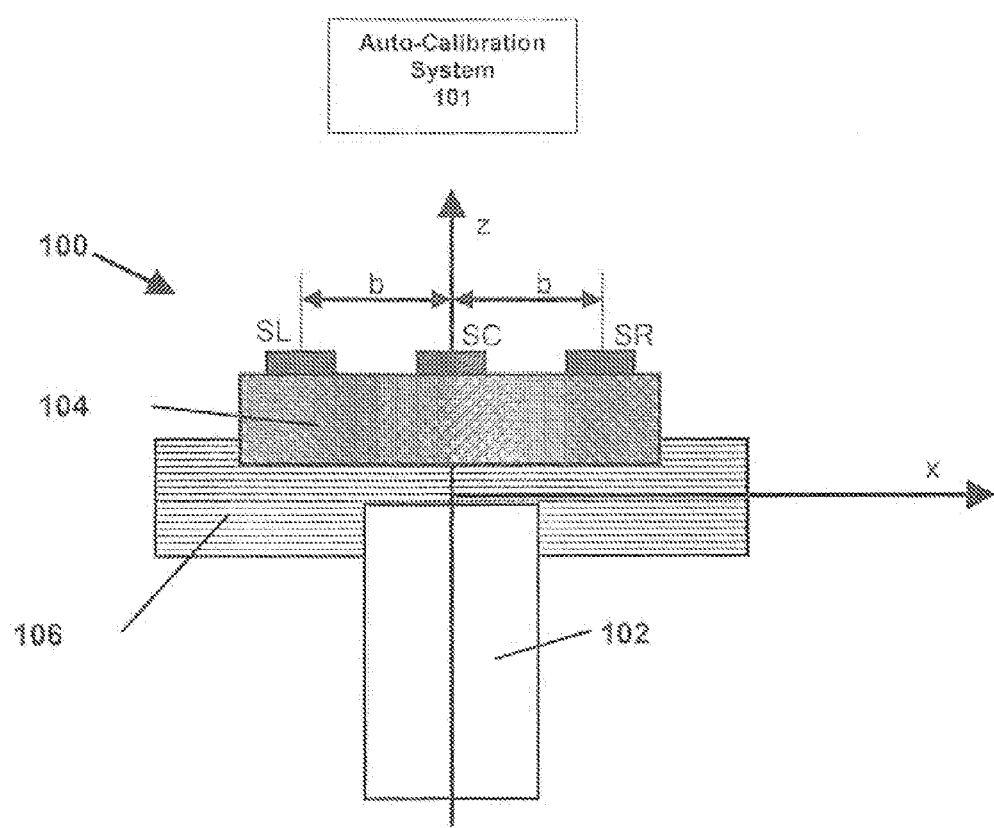
FIG. 7 depicts a current sensor system according to an embodiment.

If sensor system 100 utilizes auto-calibration, it is less important to know the magnetic sensitivity of the sensor element SL, SC and/or SR because it is calibrated in use by the auto-calibration system 101 (refer to FIG. 7).

In embodiments comprising magneto-resistive sensor elements, it can be advantageous to align the sensor elements in such a way that a part of the magnetic field from the current/onto the sensor elements SL, SC and/or SR adds to the anisotropy field, which is aligned in parallel to the long strip of the magneto-resistive resistor, thereby reducing the sensitivity (slope of the output signal versus small changes of current) of the sensor element SL, SC and/or SR. An advantage of this method is that at large currents the sensitivity of the magneto-resistive strips decreases, which prevents the strips from going into saturation too easily.

Figure 2:
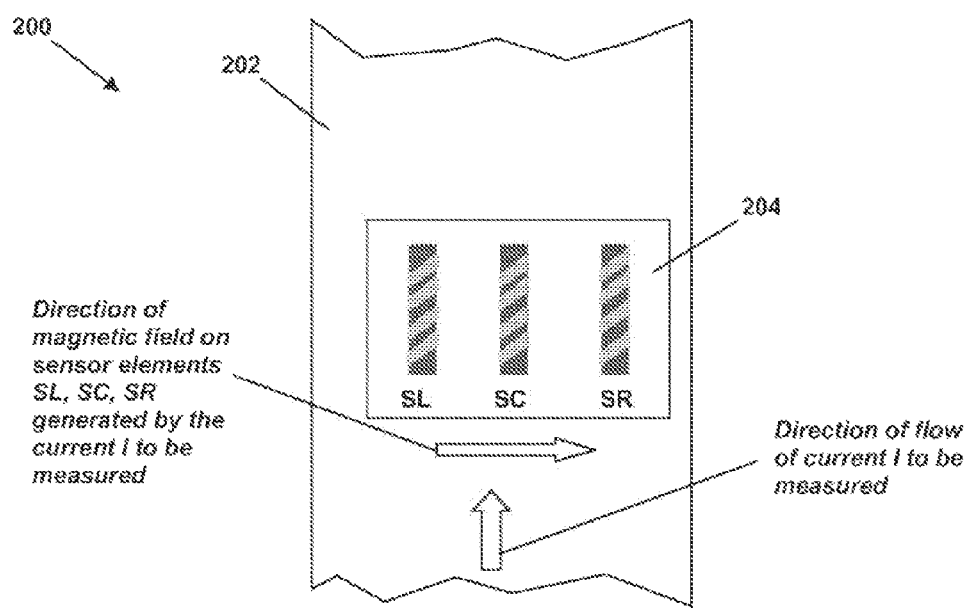
FIG. 2 depicts a current sensor system according to an embodiment.

One simple way to do this is depicted in FIG. 2. In FIG. 2, a sensor system 200 comprises a conductor 202, substrate 204 and three sensor elements SL, SC and SR arranged on substrate 204. In general, sensor elements SL, SC and SR should have a negligible hysteresis. Thus, good sensor technologies therefore include XMR, such as anisotropic magneto-resistive (AMR), giant magnetoresistive (GMR), tunneling magneto-resistive (TMR) or colossal magneto-resistive (CMR) in embodiments. Sensor elements SL, SC and SR comprise AMR sensor elements in one embodiment but can comprise other magneto-resistive technologies in other embodiments. While each sensor element SL, SC and SR can comprise a plurality of AMR sensor strips, only a single strip for each is depicted in FIG. 2. As depicted, the barber poles of each strip are arranged at 45 degrees with respect to the direction of the overall strip.

In the embodiment of FIG. 2, the magnetic field of current I does not add to the anisotropy field of the AMR resistor strips of SL, SC and SR. At large currents I, the AMR strips of SL, SC and SR go into saturation.

Figure 3A:
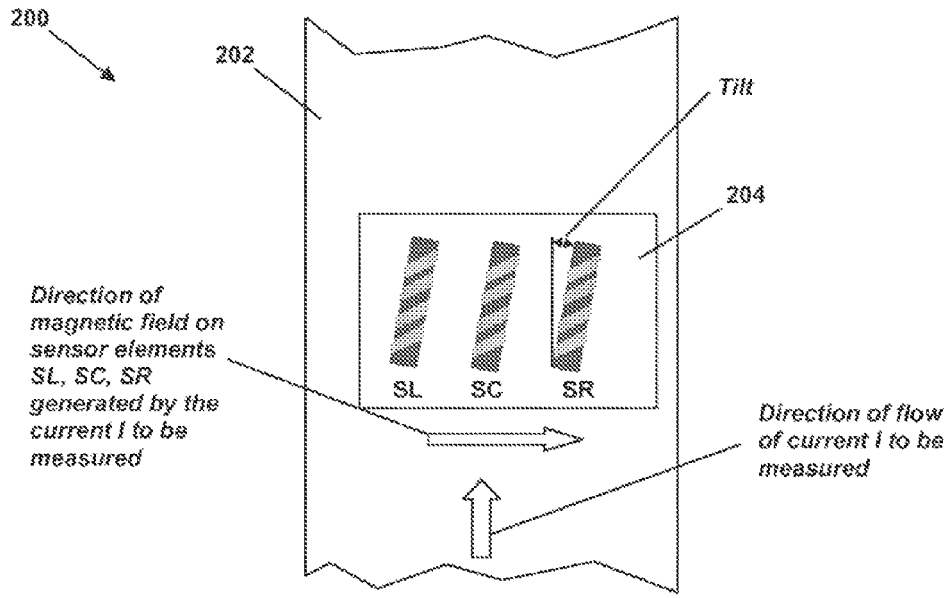
FIG. 3A depicts a current sensor system according to an embodiment.

Another embodiment is depicted in FIG. 3A, in which a small part of the field of the current adds to the anisotropy field of the AMR resistor strips, and at large currents I the AMR resistors of SL, SC and SR do not go into saturation as early any longer. Comparing the embodiments of FIGS. 2 and 3, in FIG. 3 sensor elements SL, SC and SR are themselves slightly tilted with respect to the direction of current flow in conductor 202.

Figure 3B:
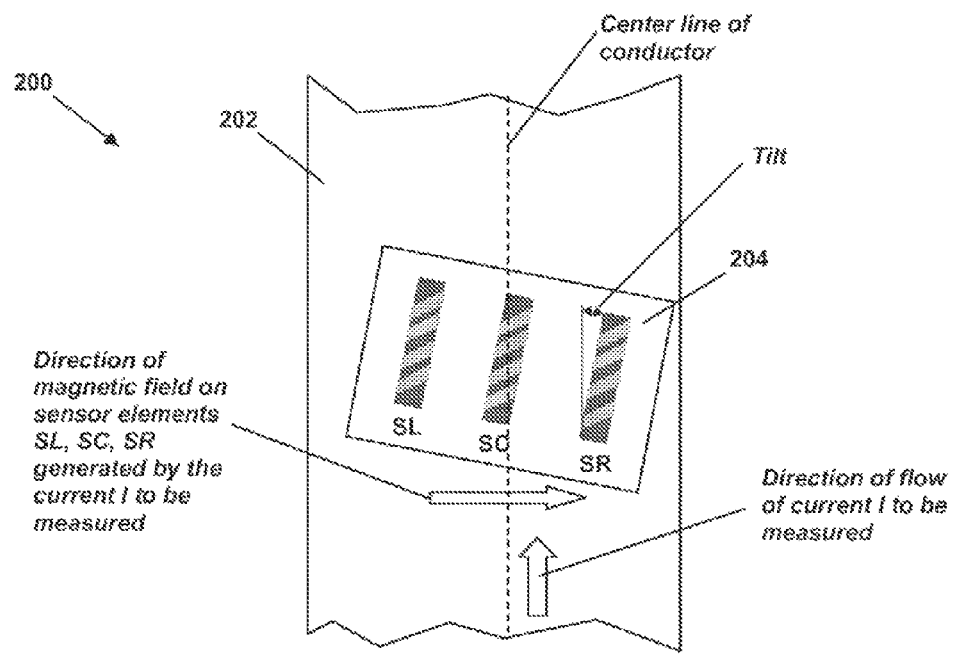
FIG. 3B depicts a current sensor system according to an embodiment.
Figure 3C:
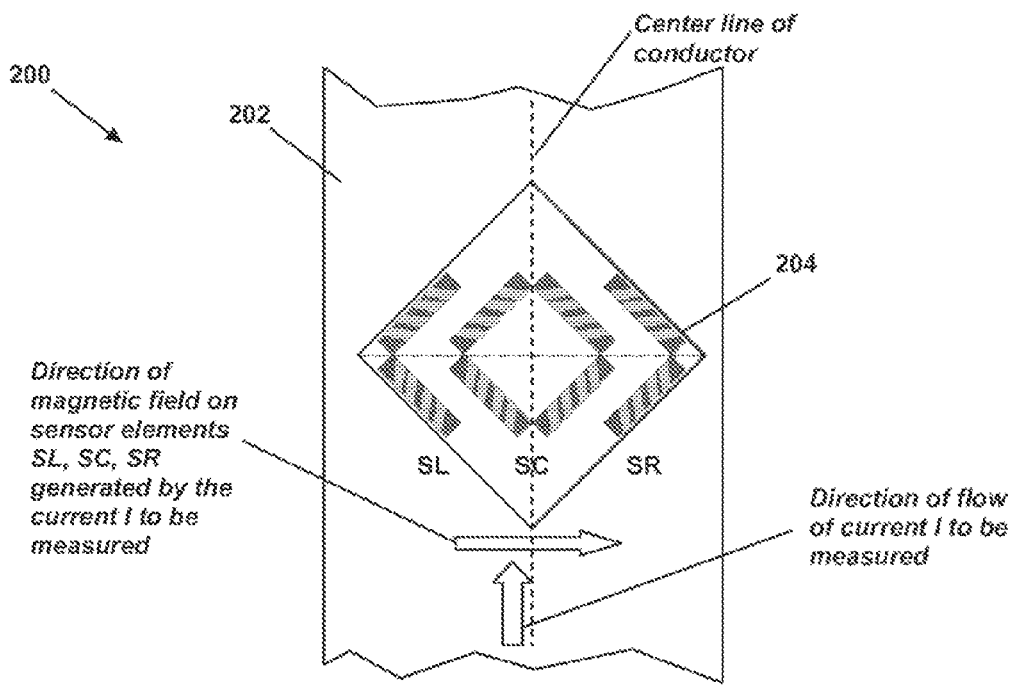
FIG. 3C depicts a current sensor system according to an embodiment.

Similarly, it is also possible to tilt substrate 204 on which sensor elements SL, SC and SR are mounted, as depicted in FIG. 3B. Further still, AMR sensor elements with at least two notably different strip directions can be used, as depicted in FIG. 3C. If an applied magnetic field drives one AMR resistor into saturation, the other portion remains working, making the AMR more robust with respect to background magnetic fields. It is also possible in an embodiment to add a third AMR portion parallel to the current flow direction in between the aforementioned two portions at +/−45 degrees to the current flow direction in an effort to adjust the sensitivities of the AMR with respect to the current and with respect to the background magnetic fields.

Figure 4:
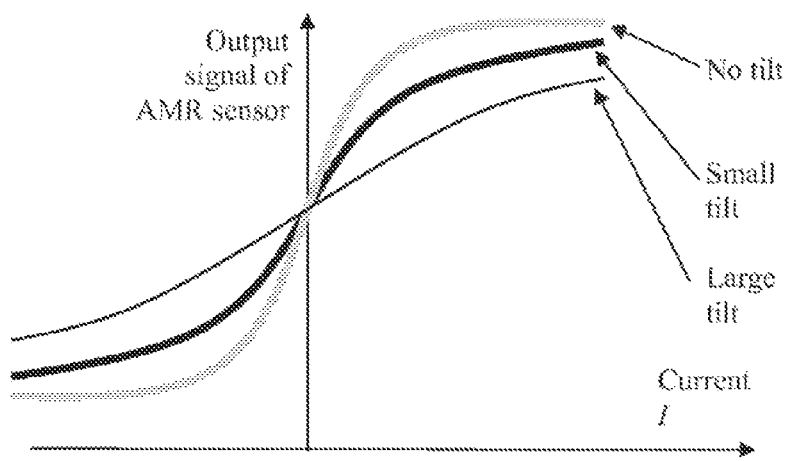
FIG. 4 depicts a graph of sensor output signals according to embodiments.

FIG. 4 shows output signals of the AMR sensor elements SL, SC and SR for various tilt angles. If the AMR strips of SL, SC and SR are not tilted with respect to the direction of current flow in conductor 202, the sensitivity of the elements is large (steep slope), but saturation occurs at large currents and the sensor elements SL, SC and SR can then no longer detect current changes. If the strips are tilted, the output curve is somewhat flattened, but the sensors SL, SC and SR no longer saturate at large currents.

In other embodiments, and referring again to FIG. 1, conductor 102 can be circular, with
a radius a which results in the following Bx fields, if the BC-sensor is at a distance of r>a to the center of the conductor and the spacing of the sensor elements on the substrate is b:

$$BxC = \mu 0 * CD * a^2/(2*r)$$

$$BxL = BxR = \mu 0 * CD * a^2 * r/2/(r^2+b^2)$$

where CD is the homogeneous current density in the cross-section of the conductor. In one embodiment, for r=4.5 mm, a=4 mm and b=2 mm, we get $BxL=37.1$ µT/A and $BxC=44.4$ µT/A. This gives a total signal of $BsC-BxL/2-BxR/2=7.33$ µT/A. For r=4.6 mm and a and b unchanged, 6% smaller total signals result. Thus, if a stability over lifetime of 0.1% is desired, the radial distance of the substrate can be accurate in embodiments up to about 1.7 µm. Therefore, in embodiments, organic materials (e.g., plastic) are less desired to attach the substrate to the conductor, while highly filled mold compound or glass, ceramic, porcelain or other suitable materials can be suitable.

Figure 5:
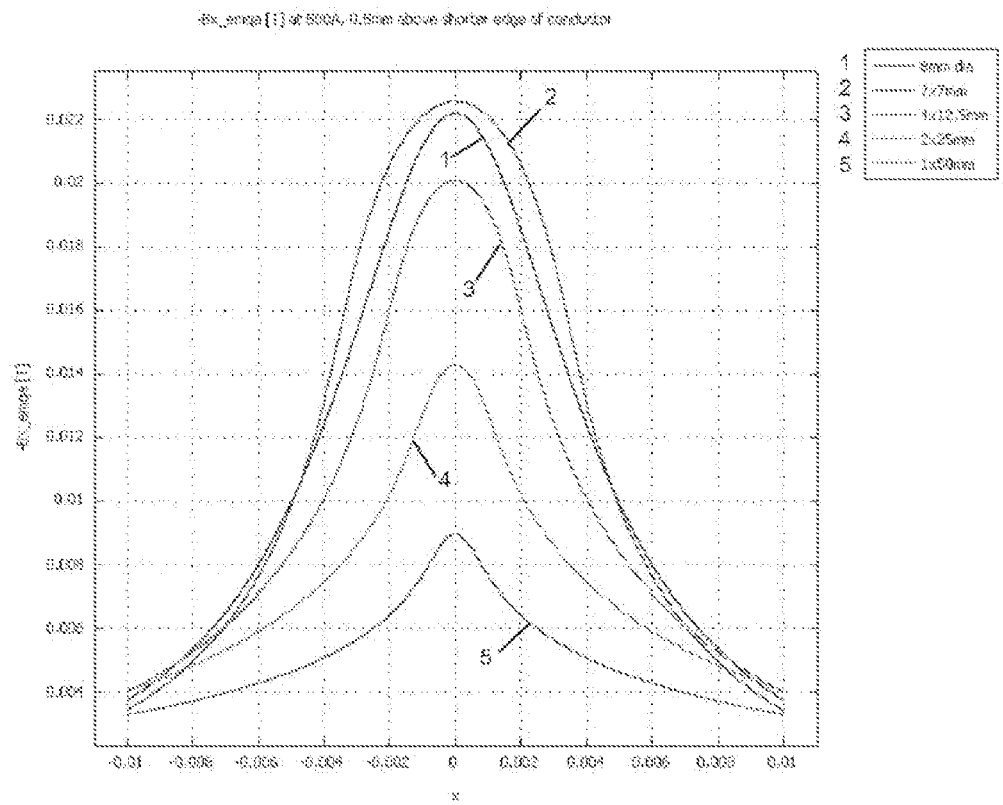
FIG. 5 depicts components of sensor signals at various distances according to embodiments.

FIG. 5 depicts the Bx component at a distance of 0.5 mm above various conductors: curve 1 is for a conductor with a circular cross-section of 8 mm diameter; curve 2 is for a square conductor with a 7 mm×7 mm cross section; and curves 3-5 are for conductors having rectangular cross-sections of 4 mm×12.5 mm, 2 mm×25 mm and 1 mm×50 mm, respectively. The cross-sectional area for each in these examples is constant at about 50 mm². The total current through the conductor is about 500 A, which provides a reasonable current density of about 10 A/mm². The three sensor elements are located at x=−2 mm, 0 mm and +2 mm, respectively. In general, conductor configuration should be selected in embodiments to maximize the overall magnetic field to maximize the overall signal BC-BR/2 but not to maximize BC, BR and/or BL individually.

Figure 6:
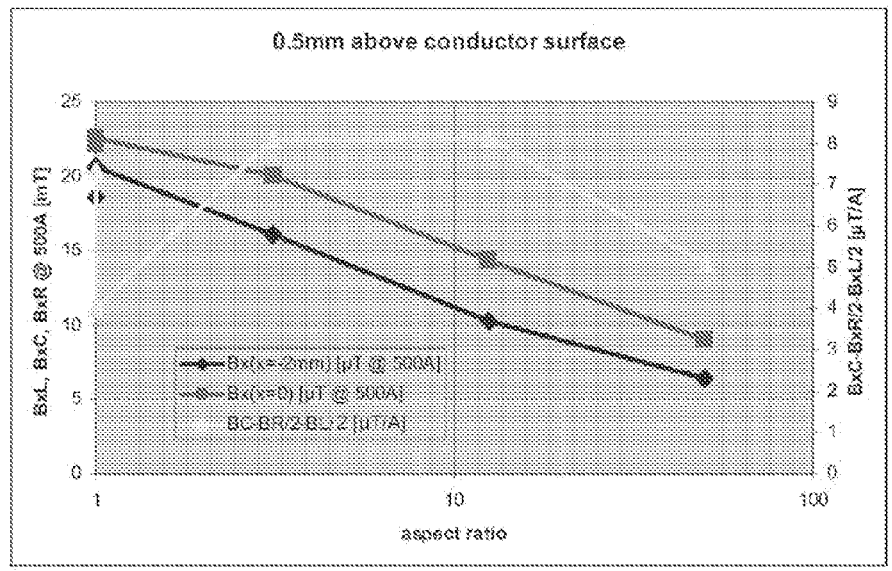
FIG. 6 is a plot summarizing data of FIG. 5.

Referring also to FIG. 6, which summarizes data from the plot of FIG. 5, the total signal BC-(BR+BL)/2 is at a maximum for aspect ratios of about 3 to 12, for example about 10, yet even the circular cross-section (curve 1) with an aspect ratio of one is quite good. For small aspect ratios, however, the common mode of Bx fields (the average of BxL, BxC and BxR) is also large, which is to be avoided in embodiments comprising XMR sensors, because large common mode fields drive the XMRs into saturation, thereby reducing the sensitivity without any contribution to the total output signal. Therefore, conductors with rectangular cross-sections and aspect ratios of about 10 can be more suitable in embodiments. Such conductors, however, can have a lower bandwidth, with the field expelled from the interior of the conductors at high frequencies, which changes the Bx field versus frequency. To maximise the bandwidth of the current sensor, conductors having circular cross-sections or cross-sections with aspect ratios close to one can be implemented in embodiments. Additional macroscopic conducting parts, such as a die paddle in the package of the sensor, can also be avoided in embodiments.

Embodiments therefore relate to current sensor systems comprising a simple conductor and magnetic field sensor elements. In embodiments, a plurality of sensor elements are used, such as two or three, which are coupled to a substrate relative to the conductor. The sensor elements are coupled to a surface of the substrate parallel to but facing away from the conductor in one embodiment, though other surfaces of the substrate can be utilized in other embodiments. In an embodiment having three sensor elements, the sensor elements are generally arranged symmetrically with respect to a center of the conductor. For example, a first sensor element is disposed at the center line of the conductor, with the other two sensor elements linearly arranged with one on either side and equidistantly spaced from the first sensor element. The conductor can have various cross-sections, with a particular cross-section used in embodiments to maximize one or more characteristics. For example a conductor with a circular cross-section can be used in embodiments in which high bandwidth is desired, while rectangular cross-sections having aspect ratios of about 10 and a minor surface coupled to the major surface of the substrate can be used in embodiments in which sensitivity is desired to be optimized. To increase accuracy in spite of non-linearities, auto-calibration techniques can also be used in embodiments.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A current sensing system comprising:
   a conductor having a cross-sectional geometry along a current path;
   a substrate coupled to the conductor, the substrate including a surface defining a plane, wherein the conductor is on only one side of the plane; and
   first, second, and third sensor elements arranged on the surface of the substrate and configured to generate first, second, and third signals, respectively, the first sensor element being arranged substantially equidistant between the second sensor element and the third sensor element, wherein an output of the current system is related to a function of corresponding values of the first, the second, and the third signals.

2. The system of claim 1, wherein the surface of the substrate faces away from the conductor.

3. The system of claim 1, wherein the cross-sectional geometry is circular.

4. The system of claim 1, wherein the cross-sectional geometry is rectangular.

5. The system of claim 4, wherein a major surface of the conductor is parallel to the surface of the substrate.

6. The system of claim 4, wherein a minor surface of the conductor is parallel to the surface of the substrate.

7. The system of claim 1, further comprising an isolation layer coupled between the substrate and the conductor.

8. The system of claim 1, wherein the first, the second, and the third sensor elements comprise magneto-resistive (XMR) sensor elements.

9. The system of claim 8, wherein the XMR sensor elements are selected from the group consisting of anisotropic magneto-resistive (AMR), giant magneto-resistive (GMR), tunneling magneto-resistive (TMR) and colossal magneto-resistive (CMR).

10. The system of claim 8, wherein the XMR sensor elements are disposed parallel with the current path.

11. The system of claim 8, wherein at least one of the XMR sensor elements or the substrate are disposed at an angle with respect to the current path.

12. The system of claim 1, wherein the first, the second, and the third sensor elements are sensitive to a component of a magnetic field that is parallel to the surface of the substrate and perpendicular to the current path.

13. The system of claim 1, wherein the output of the current sensing system is related to a value of the first signal reduced by a portion of a value of the second signal and a portion of a value of the third signal.

14. The system of claim 1, wherein the output of the current sensing system is related to a difference of a value of the first signal and half of a sum of a value of the second signal and a value of the third signal.

15. The system of claim 1, wherein the conductor is coupled to another surface of the substrate that is opposite the surface.

16. The system of claim 15, wherein the surface and the other surface are substantially parallel to each other.

17. The system of claim 1, wherein the first, the second, and the third sensor elements are arranged on another side of the plane.

18. A method comprising:
   forming a current sensor comprising:
      a conductor having a cross-section along a current path,
      a substrate coupled to the conductor, the conductor being on only one side of a plane defined by a surface of the substrate, and
      three sensor elements arranged substantially equidistantly spaced apart on the surface of the substrate and configured to generate first, second, and third signals, respectively;
   causing a current to flow in the conductor to induce a magnetic field that can be sensed by the three sensor elements; and
   receiving an output of the current sensor, wherein the output of the current sensor is a function of corresponding values of the first, the second, and the third signals.

19. The method of claim 18, further comprising tilting at least one of the three sensor elements or the substrate with respect to a direction of current flow in the conductor.

20. A current sensing system comprising:
   a conductor having a cross-section along a current path;
   a substrate coupled to the conductor, the substrate including a surface defining a plane, wherein the conductor is on only one side of the plane; and
   first and second sensor elements spaced apart from one another and arranged along an axis on the surface of the substrate, the first sensor element being arranged at a first distance relative to a center line of the conductor and the second sensor element being arranged at a second distance relative to the center line of the conductor, and the first and second sensor elements being sensitive to magnetic field components parallel to the surface and induced by current flow in the conductor.

21. The system of claim 20, wherein the first sensor element is disposed on the center line of the conductor.

22. The system of claim 20, wherein an auto-calibration field is generated by the system, the auto-calibration field having a first component acting in a first direction on the first sensor element and a second component acting in a second direction on the second sensor element, the first and second directions being in opposite directions.

23. The system of claim 22, wherein auto-correlation values of a difference between each output signal of the first and second sensor elements with at least two predetermined patterns is computed, and wherein a current in the conductor is a function of the auto-correlation values and the auto-calibration field.

24. The system of claim 20, wherein the first and second distances are unequal.

25. The system of claim 20, wherein the center line of the conductor is perpendicular to the axis.

* * * * *